United States Patent
Chen

(10) Patent No.: US 7,474,551 B2
(45) Date of Patent: Jan. 6, 2009

(54) METHOD FOR TRIMMING PROGRAMMABLE RESISTOR TO PREDETERMINED RESISTANCE

(75) Inventor: Bei-Hsiang Chen, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 11/675,071

(22) Filed: Feb. 14, 2007

(65) Prior Publication Data

US 2007/0133335 A1    Jun. 14, 2007

Related U.S. Application Data

(62) Division of application No. 11/160,101, filed on Jun. 9, 2005, now Pat. No. 7,321,501.

(51) Int. Cl.
G11C 17/00    (2006.01)

(52) U.S. Cl. .................. 365/100; 365/104; 365/148

(58) Field of Classification Search .......... 365/225.7, 365/100, 104, 148; 257/360, 355
See application file for complete search history.

(56) References Cited

U.S. PATENT DOCUMENTS

| 5,502,395 | A   | 3/1996  | Allen |
| 6,624,499 | B2* | 9/2003  | Kothandaraman et al. ... 257/529 |
| 6,888,745 | B2  | 5/2005  | Ehiro et al. |
| 7,202,532 | B2* | 4/2007  | Czech et al. ................. 257/360 |
| 7,227,238 | B2* | 6/2007  | Ito et al. ...................... 257/529 |
| 7,254,078 | B1* | 8/2007  | Park et al. ................. 365/225.7 |
| 2005/0189613 | A1* | 9/2005 | Otsuka et al. ............... 257/529 |
| 2005/0247997 | A1* | 11/2005 | Chung et al. ................ 257/530 |
| 2006/0067104 | A1  | 3/2006  | Hsu |
| 2006/0108662 | A1* | 5/2006  | Kothandaraman et al. ... 257/528 |
| 2006/0158239 | A1* | 7/2006  | Bhushan et al. ............. 327/291 |
| 2006/0267669 | A1* | 11/2006 | Robinson et al. ............ 327/525 |

* cited by examiner

Primary Examiner—Pho M. Luu
(74) Attorney, Agent, or Firm—Winston Hsu

(57) ABSTRACT

A programmable resistor is an e-fuse connecting to a source/drain of a MOS transistor. A voltage is provided to the gate of the MOS transistor to partially blow the programmable resistor. Following that, a resistance comparator is used to compare the resistance of the programmable resistor to a predetermined resistance. If the resistance of the programmable resistor conforms to the predetermined resistance, then the programmable resistor is set. If it does not conform to the predetermined resistance, then it is determined whether partially blowing it again would make it exceed the predetermined resistance. If it will exceed the predetermined resistance, then it is not blown again. If it will not exceed the predetermined resistance, then the resistor is partially blown again so as to approach the predetermined resistance.

5 Claims, 5 Drawing Sheets

METHOD FOR TRIMMING PROGRAMMABLE RESISTOR TO PREDETERMINED RESISTANCE

CROSS REFERENCE TO RELATED APPLICATIONS

This divisional application claims the benefit of co-pending U.S. application Ser. No. 11/160,101, filed on Jun. 9, 2005 and included herein by reference.

BACKGROUND OF THE INVENTION

1. Field of the Invention

The present invention is related to trimming a programmable resistor to a predetermined resistance, and especially to trimming an electronic fuse (e-fuse) to a predetermined resistance.

2. Description of the Prior Art

An e-fuse is an electronic fuse (poly-fuse) that can be broken by an electrical current. Traditional e-fuses are used in redundancy circuits of semiconductor memory devices. The redundancy circuit includes a plurality of e-fuses. When a defective memory cell is found and needs to be avoided, the corresponding poly-fuse is broken by an electrical current, and the defective memory cell is replaced by a redundant memory cell to allow the memory to function properly.

Please refer to FIG. 1. FIG. 1 illustrates the device structure of such an e-fuse. The traditional e-fuse typically includes a poly-fuse strip 12 with one end serially connected to a source/drain 18 of a MOS transistor 16, and the other end connected to a positive voltage (i.e. the fuse source voltage, $V_{FS}$). The MOS transistor 16 has another source/drain 20 that is connected to ground, and a gate 22 that is biased to a gate voltage ($V_g$) to allow an electric current to flow through the poly-fuse 12 and blow the poly-fuse 12 in a very short time. Generally, the gate includes a polysilicon layer, a silicide layer, and a silicon nitride cap layer. The poly-fuse 12 has structure similar to the gate, that is, a stack of a polysilicon layer, a silicide layer, and a silicon nitride cap layer.

Referring to FIG. 2, a gate voltage ($V_g$) vs. time plot showing a pulse voltage waveform applied to a gate of a MOS transistor of an e-fuse device to be blown according to prior art method is illustrated. As shown in FIG. 2, the pulse voltage waveform is a single-level square waveform that can be generated by a conventional voltage pulse generator. The simple pulse voltage waveform in FIG. 2 has a maximum voltage value $V_{IH}$ during time period $T_2$-$T_1$, and a minimum voltage value $V_{IL}$ that is typically 0 volts. Ordinarily, the maximum voltage value $V_{IH}$ is about the threshold voltage of the MOS transistor. When the e-fuse is blown, the cobalt and boron inside migrate out. At this time, the resistance of the e-fuse will rise. By controlling the time period $T_2$-$T_1$, the cobalt and boron can be moved out thoroughly so part of polysilicon is depleted. As a result, the resistance of the poly-fuse becomes very high, and even becomes an ultra-high resistance. For example, a poly-fuse strip of an e-fuse device having a resistance of about 100 ohms before being blown may have a resistance of about one megohm after being blown.

In the conventional method, the e-fuse generally has two states, the unblown state in which the poly-fuse strip has low resistance; and the blown state, in which the poly-fuse strip has an ultra-high resistance. Due to this characteristic, e-fuses have also been applied in programmable read-only memories (PROMs) to facilitate input of data. When a "1" is transmitted into the PROM, a high voltage is applied to the gate to blow the poly-fuse into a megohm resistance to form an off-state. Otherwise, the poly-fuse is not blown, and the circuit is at an on-state when a "0" is transmitted into the PROM. The fuse blowing process using input voltages is programming. Through the programming process, the e-fuse is able to save data as a digital bit. However, once the poly-fuse is blown, it becomes an open circuit (off-state) forever. In another words, the e-fuse is unrecoverable.

SUMMARY OF THE INVENTION

The primary object of the present invention is to provide a method for trimming a programmable resistor to a predetermined resistance.

According to the claimed invention, a voltage is provided to partially blow the programmable resistor. The voltage is a square waveform pulse that is provided to a transistor gate. Following that, a resistance comparator is used to compare the resistance of the programmable resistor with a predetermined resistance. If the resistance of the programmable resistor conforms to the predetermined resistance, the programmable resistor is not partially blown again and the trimming process is complete. If the resistance of the programmable resistor does not conform to the predetermined resistance, it is determined whether partially blowing the programmable resistor again will make it exceed the predetermined resistance. If it will exceed the predetermined resistance, then the programmable resistor is not partially blown again. If it will not, then the programmable resistor is partially blown again, and subsequent times as required, until it reaches the predetermined resistance.

According to the present invention, since the programmable resistor can have different resistances by controlling the blowing times, it has more than two states. Therefore, in a memory, the programmable resistor can record more bits of data and be used more than once by changing the trip point.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
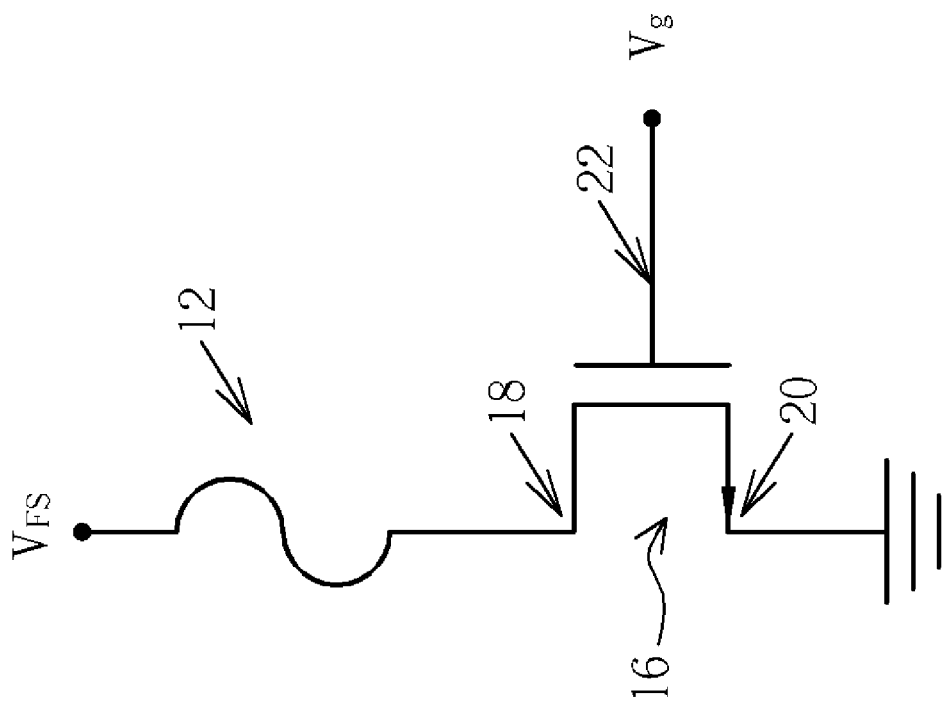
FIG. 1 is a schematic view of the conventional e-fuse device structure.
Figure 2:
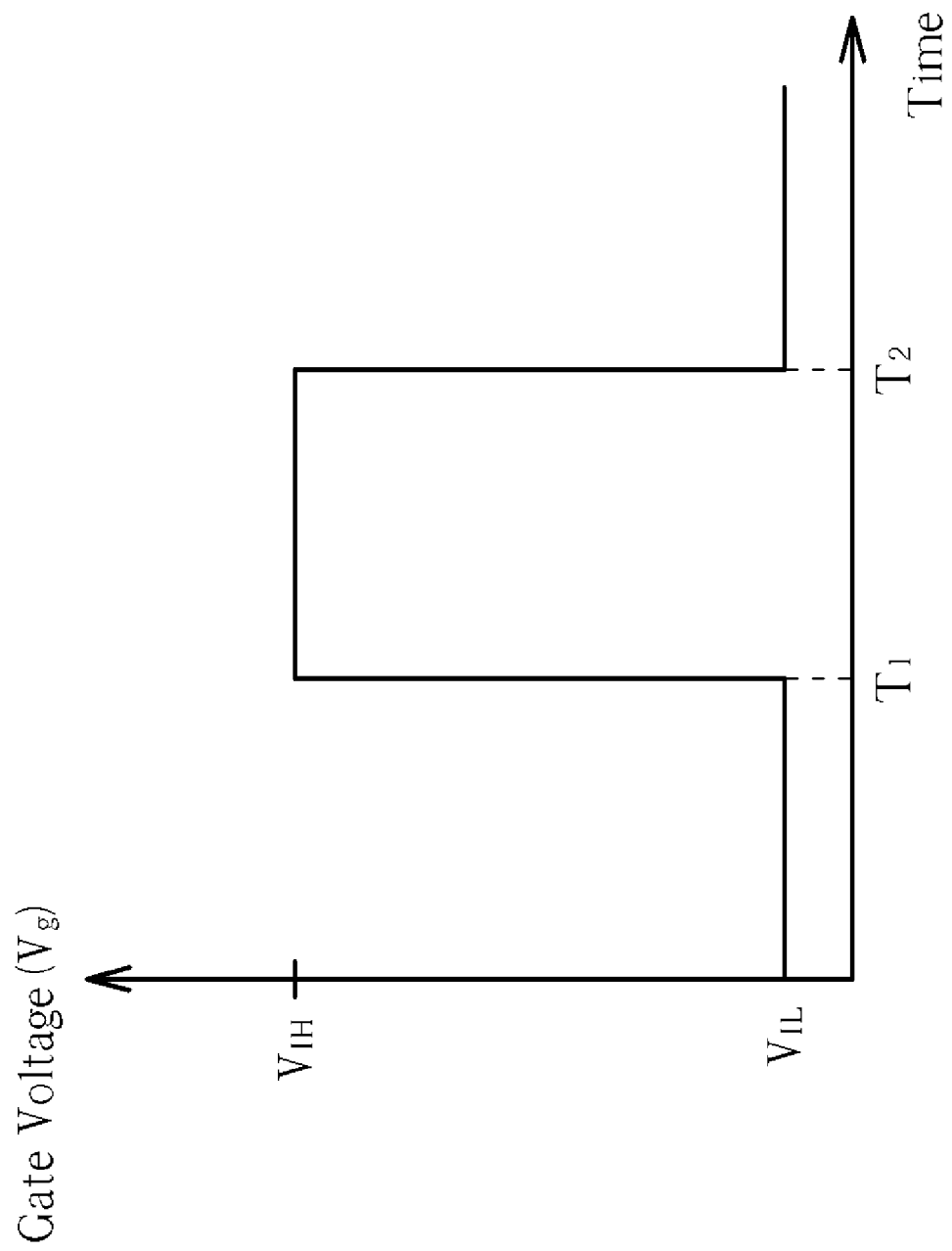
FIG. 2 is a $V_g$ vs. time plot showing a pulse voltage waveform applied to a gate of a MOS transistor of an e-fuse device in the prior art.
Figure 3:
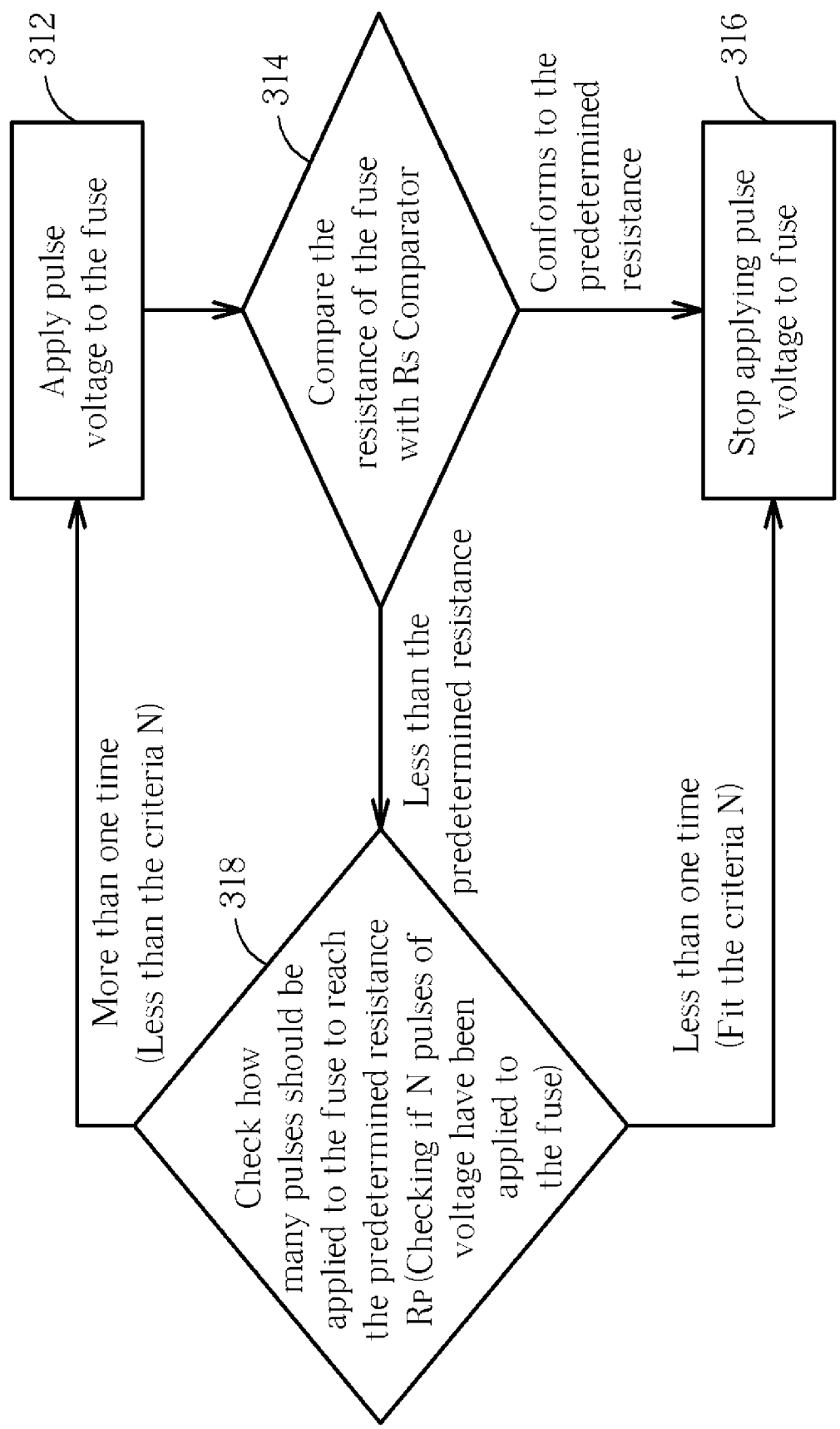
FIG. 3 is a flowchart of an embodiment according to the present invention.
Figure 4:
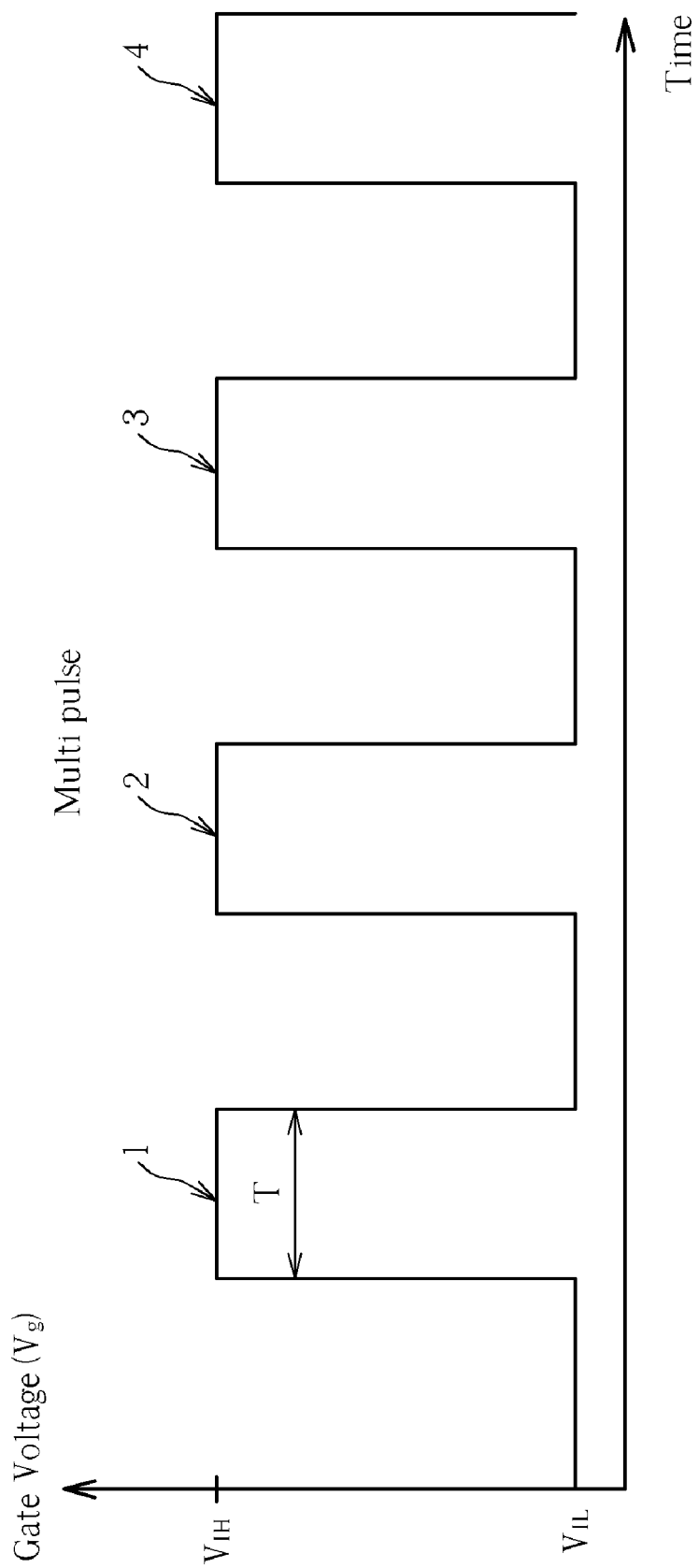
FIG. 4 is a V vs. time plot showing a pulse voltage waveform applied to a gate of a MOS transistor of an e-fuse device according to the present invention.

A method for trimming a programmable resistor to a predetermined resistance is disclosed in the present invention. Please refer to FIG. 3. FIG. 3 is a flowchart of an embodiment according to the present invention. According to the embodiment, the programmable resistor is an e-fuse. One end of the e-fuse is connected to a drain/source of an MOS transistor. In another words, the device structure is similar to the conventional e-fuse device. By providing voltage pulses to the gate of the MOS transistor, the e-fuse is blown to a predetermined resistance. Please refer to FIG. 4. FIG. 4 is a voltage (V) vs. time (T) plot illustrating a pulse voltage waveform applied to a gate of a MOS transistor of an e-fuse device according to an embodiment of the present invention. According to FIG. 4, the pulse voltage provided according to the present invention has a square waveform. The period T of the square waveform according to the present invention is shorter than that of the conventional single-level square waveform, which is indicated as $T_2$-$T_1$ in FIG. 2. Generally, compared to the conventional single-level waveform, more pulses of voltage are offered in the present invention. However, a single pulse, which will not completely blow the e-fuse, may also be applied to the e-fuse according to the present invention.

Please refer to FIG. 3; the method is described as follows. A pulse voltage is provided to the programmable resistor to partially blow the programmable resistor (step 312). It is noted that, the pulse time is short to prevent the programmable resistor from having the completely blown ultra-high resistance. Following that, a resistance comparator is used to compare the resistance of the programmable resistor with the predetermined resistance (step 314). If the resistance of the programmable resistor conforms to the predetermined resistance $R_P$, then stop applying pulse voltage to the programmable resistor to complete the trimming process (step 316). If the resistance of the programmable resistor does not conform to the predetermined resistance $R_P$, then calculate how many pulses should be provided to the programmable resistor to reach the predetermined resistance $R_P$ (step 318). If the necessary pulse number is less than one, then stop applying pulse voltage to the programmable resistor and complete the trimming process (step 316). On the contrary, if the necessary pulse number is more than or equal to one, then provide the pulse voltage continuously to blow the programmable resistor to the predetermined resistance (step 312). When the required number of pulses is less than one, a single pulse will cause the resistance of the programmable resistor to exceed the predetermined resistance $R_P$. Therefore, in this case, the voltage applied to the programmable resistor must be stopped, or optionally, the time period or the value of the pulse voltage can be adjusted so as to cause the programmable resistor to reach the predetermined resistance $R_P$.

In addition, according to the present invention, the programmable resistor may be trimmed in other ways. For example, the critical number of pulses N can be calculated in advance. The number N indicates the most pulses of voltage that should be applied to the programmable resistor under a fixed voltage value and a fixed time period to reach the predetermined resistance $R_P$. That is, if the pulse number provided to the programmable resistor is more than N, the resistance of the programmable resistor will be higher than the predetermined resistance $R_P$. After the N is determined, the process shown in FIG. 3 is performed. According to FIG. 3, after applying the pulse voltage to the programmable resistor (step 312), the resistance of the programmable resistor is compared to the predetermined resistance (step 314). If the resistance of the programmable resistor is lower than the predetermined resistance, then it is determined whether the pulses applied to the programmable resistor number more than N. If they are not more than N, then step 312 is performed again to apply the pulse voltage to the programmable resistor. Certainly, another way is to continuously apply N pulses of voltage the programmable resistor immediately to reach the predetermined resistance.

It should be noted that, according to the present invention, the parameters above can be adjusted to meet all kinds of requirements. For example, the offering time period and the value of the voltage pulse are adjustable. Furthermore, in step 312, one or more pulses of voltage may be provided at one time. In addition, the programmable resistor may be other material with similar structure to the e-fuse.

Figure 5:
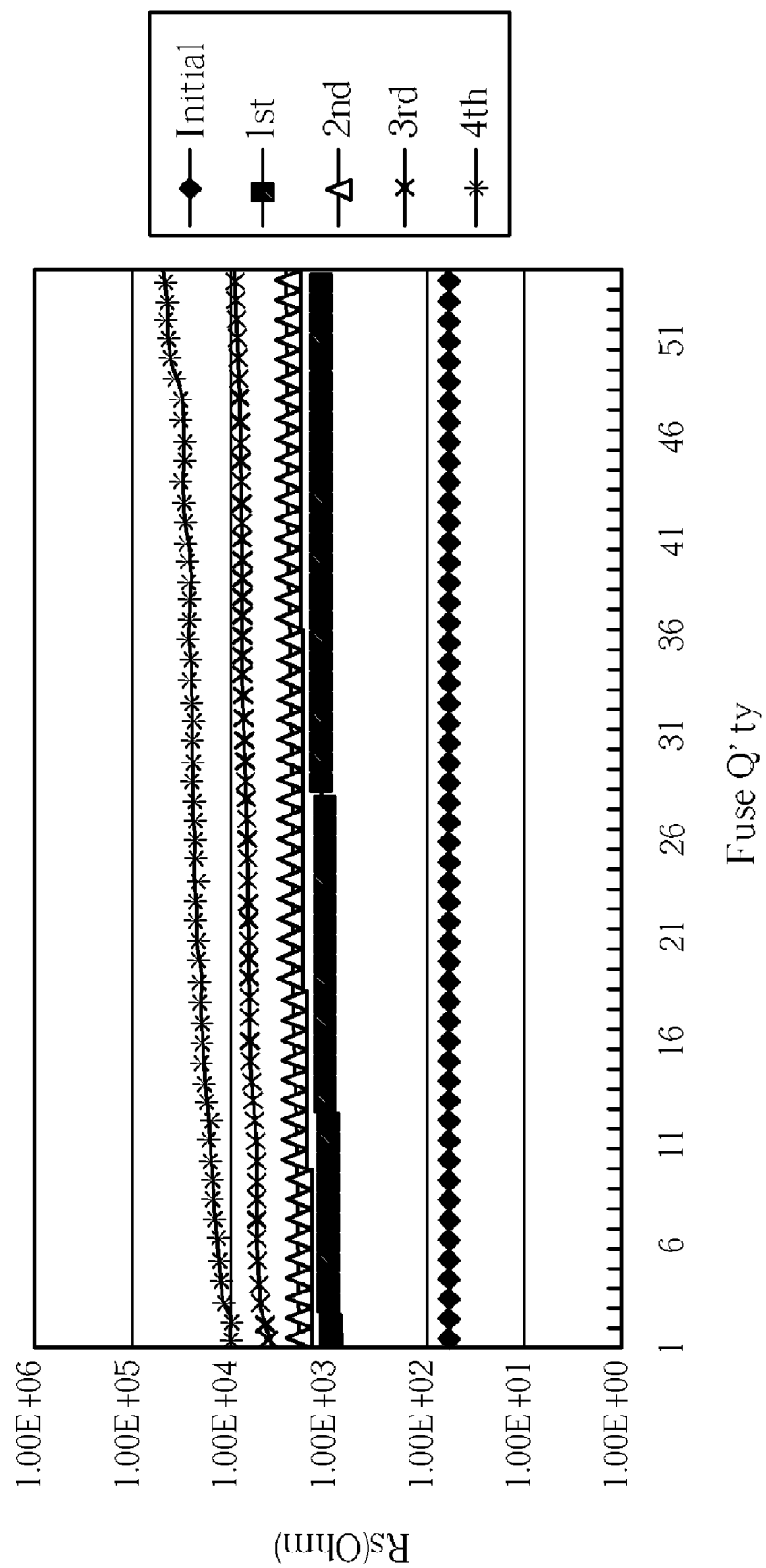
FIG. 5 is a plot showing the resistance distribution of an e-fuse blown according to the present invention.

Regarding the application of the programmable resistor, when the predetermined resistance $R_P$ is a megohm ($10^6$ ohms), the programmable resistor can serve as a safety fuse. Furthermore, the programmable resistor according to the present invention can also be used in a memory to allow data input as the conventional e-fuses. Please refer to FIG. 4 and FIG. 5. When a first pulse voltage is provided to an e-fuse as shown in FIG. 4, the resistance of the e-fuse reaches a first resistance (1st) in FIG. 5. Similarly, when a second pulse voltage is provided to the e-fuse, the resistance of the e-fuse reaches the second resistance. In another words, by controlling the number of pulses applied to the e-fuse, the resistance of the e-fuse is precisely controlled. Therefore the e-fuse can be used in multi-level-programming and multi-times-programming ways.

Regarding multi-level-programming, an e-fuse is able to have multi-states, so as to record more data. For example, the e-fuse of a memory may be distributed into four states: unblown, partially blown to 5000 ohm, partially blown to 50000 ohm, and partially blown to 500000 ohm. Compared to conventional e-fuse, which has only two states, on-state and off-state, can only record data "0", and data "1" by resistance of e-fuse, the e-fuse above is able to record four states of data, or two bits data. In other words, one e-fuse above can substitute for two traditional e-fuses. Certainly, an e-fuse can be distributed into even more states so as to record more data.

Regarding multiple-times-programming, by changing the trip point (data threshold) appropriately, the e-fuse would be able to be used more than once. For example, the e-fuses of a memory may be distributed into an unblown group and a 5000-ohm group. The unblown group is used to record the input "0", and the 5000-ohm group is used to record the input "1". At the next time, the standard point is shift to 5000 ohm. That is, an e-fuse blown to 5000 ohm is used to record the input "0" (those having been blown to 5000 ohm in the first round do not need to be blown again), and an e-fuse blown to a higher resistance (e.g. 50000 ohm) is used to record the input "1". Therefore, using the resistance trimming method according to the present invention, and adjusting the trip point (e.g. unblown, 5000, 50000 ohm) of data level discrimination, an e-fuse can be used several times. Accordingly, the method of the present invention can decrease the number of e-fuses needed in a memory device, and save space on a chip.

According to the present invention, the e-fuse is used more adequately, by controlling the time period and number of pulses of voltage applied to the e-fuse. When applying the present invention in a memory, the amount of fuses and the area of the fuse array are reduced. In addition, the present invention can be applied to conventional fuses, and thus can be applied easily and economically.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for trimming an electronic fuse (e-fuse), the e-fuse electrically connected to a doping zone of a transistor, the method comprising:

providing a first gate voltage pulses to a gate of the transistor until the resistance of the e-fuse reaches a first predetermined resistance; and providing a second gate voltage pulses to the gate of the transistor until the resistance of the e-fuse reaches a second predetermined resistance, the second predetermined resistance being larger than the first predetermined resistance;

wherein the e-fuse records at least two bits of data, and is used in a memory for recording data.

2. The method of claim 1, wherein the relation between the gate voltage and time is a square waveform.

3. The method of claim 1, wherein the e-fuse is reusable.

4. The method of claim 1, wherein the e-fuse is used as a programmable resistor.

5. The method of claim 1, wherein the transistor is a metal-oxide semiconductor (MOS) transistor.

* * * * *